(12) United States Patent
Imamura et al.

(10) Patent No.: US 7,379,307 B2
(45) Date of Patent: May 27, 2008

(54) WIRING BOARD AND METHOD FOR MANUFACTURING THE SAME, AND SEMICONDUCTOR DEVICE

(75) Inventors: Hiroyuki Imamura, Osaka (JP); Nozomi Shimoishizaka, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 139 days.

(21) Appl. No.: 11/466,843

(22) Filed: Aug. 24, 2006

(65) Prior Publication Data
US 2007/0057369 A1 Mar. 15, 2007

(30) Foreign Application Priority Data
Sep. 13, 2005 (JP) ............... 2005-265768

(51) Int. Cl.
*H05K 7/00* (2006.01)
(52) U.S. Cl. .............. 361/777; 361/778; 361/767; 257/737; 257/777; 257/763; 257/778
(58) Field of Classification Search .......... 361/777, 361/778; 174/250, 261
See application file for complete search history.

(56) References Cited

U.S. PATENT DOCUMENTS

| | | | | | |
|---|---|---|---|---|---|
| 5,397,864 | A | * | 3/1995 | Rai et al. | 174/261 |
| 5,955,704 | A | * | 9/1999 | Jones et al. | 174/262 |
| 6,133,637 | A | * | 10/2000 | Hikita et al. | 257/777 |
| 6,175,152 | B1 | * | 1/2001 | Toyoda | 257/690 |
| 6,208,546 | B1 | * | 3/2001 | Ikeda | 365/51 |
| 6,225,816 | B1 | * | 5/2001 | Draving et al. | 324/754 |
| 6,858,920 | B2 | * | 2/2005 | Hatauchi | 257/666 |
| 6,873,058 | B2 | * | 3/2005 | Kobayashi | 257/778 |
| 6,994,563 | B2 | * | 2/2006 | Amini et al. | 439/62 |
| 7,049,687 | B2 | * | 5/2006 | Takahashi et al. | 257/673 |
| 7,087,844 | B2 | * | 8/2006 | Ishimaru et al. | 174/250 |
| 7,301,103 | B2 | * | 11/2007 | Tanaka et al. | 174/250 |
| 2002/0172024 | A1 | * | 11/2002 | Hui et al. | 361/767 |
| 2004/0212969 | A1 | | 10/2004 | Imamura et al. | |

FOREIGN PATENT DOCUMENTS

JP 2004-327936 11/2004

* cited by examiner

*Primary Examiner*—Jeremy C. Norris
*Assistant Examiner*—Hoa C Nguyen
(74) *Attorney, Agent, or Firm*—Hamre, Schumann, Mueller & Larson, P.C.

(57) ABSTRACT

A wiring board includes: an insulating base; a plurality of conductive wirings; and bumps formed on the conductive wirings, respectively. The conductive wirings can be connected with electrode pads of a semiconductor element via the bumps. The conductive wirings include a connection terminal portion at an end portion opposite to the other end portion where the bumps are formed, and at the connection terminal portion, the conductive wirings can be connected with an external component. The conductive wirings include first conductive wirings and second conductive wirings, on which the bumps are formed respectively at a semiconductor element mounting region. The first conductive wirings extend from the bumps to the connection terminal portion. The second conductive wirings extend beyond the semiconductor element mounting region from the bumps but do not reach the connection terminal portion. End portions of the second conductive wirings extending beyond the semiconductor element mounting region are separated electrically from the first conductive wirings by a cutting portion formed at a boundary region with the first conductive wirings. Irrespective of the state of operating electrode pads of a semiconductor element to be mounted, the bumps can be arranged at constant intervals.

8 Claims, 6 Drawing Sheets

WIRING BOARD AND METHOD FOR MANUFACTURING THE SAME, AND SEMICONDUCTOR DEVICE

BACKGROUND OF THE INVENTION

1. Field of the Invention

The present invention relates to a wiring board such as a tape carrier substrate used for a chip-on-film (COF) and a method for manufacturing the same, and also relates to a semiconductor device including a semiconductor element bonded to the wiring board.

2. Description of Related Art

As one type of package modules using a film substrate, a COF has been known. FIG. 5 is a partial cross-sectional view showing an exemplary COF. The COF includes a semiconductor element 6 mounted on a tape carrier substrate made of a flexible insulating film base 1, which is protected by an encapsulation resin 7. The COF mainly is used for a driver for driving a flat panel display and the like.

The main constituents of the tape carrier substrate include the insulating film base 1, conductive wirings 2 formed on the face of the film base 1 and protrusion electrodes (bumps) 3 formed on the conductive wirings. A metal plated coating 8 is formed on a part of the conductive wirings 2 and the bumps 3, if necessary, and a solder resist layer 9 as an insulating resin is formed on the other portion of the conductive wirings 2. In general, polyimide is used as the film base 1, and copper is used as the conductive wirings 2.

The conductive wirings 2 are connected with electrode pads 10 on the semiconductor element 6 via the bumps 3. As the general connection method, after an encapsulation resin is applied at a portion on the film base 1 where the semiconductor element is to be mounted, the electrode pads 10 of the semiconductor element 6 are opposed to the bumps 3 of the tape carrier substrate, and ultrasonic energy, heat and pressure are applied thereto. FIG. 6 is a plan view of an exemplary tape carrier substrate prior to the mounting of a semiconductor element, and FIG. 7 is a plan view of an exemplary semiconductor element 6. The bumps 3 of the tape carrier substrate are formed at positions corresponding to the electrode pads 10 of the semiconductor element 6 (see JP 2004-327936 A, for example).

On the periphery of the film base 1, a feeding conductive pattern 4 is formed. In the vicinity of the boundary between the conductive wirings 2 and the feeding conductive pattern 4, a cutting region 5 is formed. At the time of the formation, the conductive wirings 2 and the feeding conductive pattern 4 are connected and electricity is fed to the conductive wirings 2 via the feeding conductive pattern 4 during the electroplating step for forming the bumps 3. After the formation of the bumps 3, the cutting region 5 is formed, whereby the conductive wirings 2 and the feeding conductive pattern 4 are separated electrically.

The following describes a method of manufacturing a conventional tape carrier substrate, with reference to FIGS. 8A to 8C. FIGS. 8A to 8C are plan views showing manufacturing steps of a conventional tape carrier substrate, FIG. 8A to FIG. 8C showing plan views of the tape carrier substrate during the respective manufacturing steps.

Firstly, with respect to a film substrate 1 on which a plurality of conductive wirings 2 and a feeding conductive pattern 4 used for electroplating are connected electrically as shown in FIG. 8A, electroplating is carried out via the feeding conductive pattern 4, whereby bumps 3 are formed as shown in FIG. 8B.

Next, as shown in FIG. 8C, a cutting region 5 is formed, whereby the conductive wirings 2 and the feeding conductive pattern 4 are separated electrically. Thereby, a tape carrier substrate is obtained on which the bumps 3 are formed on the conductive wirings 2 that are electrically independent of one another.

Note here that a connection terminal portion 11 is a part of the conductive wirings 2 and is used for the connection with an external component such as a flat panel. In general, the conductive wirings 2 and the feeding conductive pattern 4 are separated electrically by punching the tape carrier substrate at a region other than the connection terminal portion 11.

Further, although not illustrated, a metal plated coating or solder resist may be formed at the correct timing during the process of FIG. 8A to FIG. 8B or after the process.

Because of various panel sizes, definitions and the like of recent flat panel displays, the number of connection terminals of a COF as a semiconductor device with a flat panel, i.e., the number of output terminals of a semiconductor device also has been diversified. Accordingly, if different semiconductor elements are prepared according to semiconductor devices having respective numbers of output terminals, the types of the semiconductor elements will increase, so that the developing cost will increase and managing the mass production of such semiconductor elements will become complicated.

For that reason, in the case of semiconductor devices required to have similar electrical functions, the efficiency of the production will be improved when a common semiconductor element is used, even for the semiconductor devices having different output terminal numbers. However, when a common semiconductor element is used, if the number of connection terminals with an external component (flat panel) of a semiconductor device is less than the number of electrode pads of the semiconductor element, the following problems would occur.

FIG. 9 shows an exemplary tape carrier substrate where the number of connection terminals of a semiconductor device with an external component is less than the number of electrode pads of a semiconductor element. The number of bumps 3 corresponds to the number of the connection terminals with an external component. As shown in this drawing, since the number of the connection terminals with an external component of the semiconductor device is less than the number of the electrode pads of the semiconductor element, the bumps 3 cannot be arranged uniformly, where intervals between the bumps 3 are increased at a portion where the bumps 3 are not disposed.

In the case where the bumps 3 cannot be formed at constant intervals in such a way, the growth degree of the plating for forming the bumps 3 tends to vary because of the nonuniformity of the arrangement of the bumps 3. This causes a stress concentration at a certain portion during the mounting of the semiconductor element, thus increasing the possibility of connection malfunction.

Meanwhile, as shown in FIG. 9, the conductive wirings 2 are designed to have constant intervals at the connection terminal portion 11 for connection with the external component, which is for increasing the efficiency of the use of the area. Thus, even when an attempt is made to arrange the bumps 3 at constant intervals by forming additional bumps (dummy bumps) corresponding to electrode pads not used on the semiconductor element (dummy electrode pads), it is difficult to design conductive wirings for forming such dummy bumps thereon to be connected with the feeding conductive pattern.

SUMMARY OF THE INVENTION

Therefore, with the foregoing in mind, it is an object of the present invention to provide a wiring board enabling the arrangement of bumps at constant intervals irrespective of the state of operating electrode pads on a semiconductor element to be mounted, thus suppressing the concentration of a stress during the mounting of the semiconductor element.

A wiring board of the present invention includes: an insulating base; a plurality of conductive wirings provided on the insulating base; and bumps formed on the plurality of conductive wirings, respectively. The plurality of conductive wirings can be connected with electrode pads of a semiconductor element to be mounted via the bumps, and the plurality of conductive wirings include a connection terminal portion at an end portion opposite to the other end portion where the bumps are formed, and at the connection terminal portion, the conductive wirings can be connected with an external component. The plurality of conductive wirings include first conductive wirings and second conductive wirings, on which the bumps are formed respectively at a semiconductor element mounting region on which the semiconductor element is to be mounted. The first conductive wirings extend from the bumps to the connection terminal portion for connection with the external component. The second conductive wirings extend beyond the semiconductor element mounting region from the bumps but do not reach the connection terminal portion. End portions of the second conductive wirings extending beyond the semiconductor element mounting region are separated electrically from the first conductive wirings by a cutting portion formed at a boundary region with the first conductive wirings.

A wiring board manufacturing method of the present invention is for manufacturing a wiring board including: an insulating base; a plurality of conductive wirings provided on the insulating base; and bumps formed on the plurality of conductive wirings, respectively. The plurality of conductive wirings can be connected with electrode pads of a semiconductor element to be mounted via the bumps, and the plurality of conductive wirings include a connection terminal portion at an end portion opposite to the other end portion where the bumps are formed, and at the connection terminal portion, the conductive wirings can be connected with an external component. The method includes the steps of: using the insulating base having first conductive wirings and second conductive wirings as the plurality of conductive wirings provided thereon, the first conductive wirings extending from a position where the bumps are to be formed to the connection terminal portion for connection with the external component and the second conductive wirings extending beyond a semiconductor element mounting region from the position where the bumps are to be formed and not reaching the connection terminal portion, the first conductive wirings and the second conductive wirings being connected electrically; carrying out electroplating by feeding electricity via the second conductive wirings, so as to form the bumps on the first conductive wirings and the second conductive wirings; and forming a cutting portion that separates the first conductive wirings and the second conductive wirings electrically.

These and other advantages of the present invention will become apparent to those skilled in the art upon reading and understanding the following detailed description with reference to the accompanying figures.

DETAILED DESCRIPTION OF THE INVENTION

Figure 1:
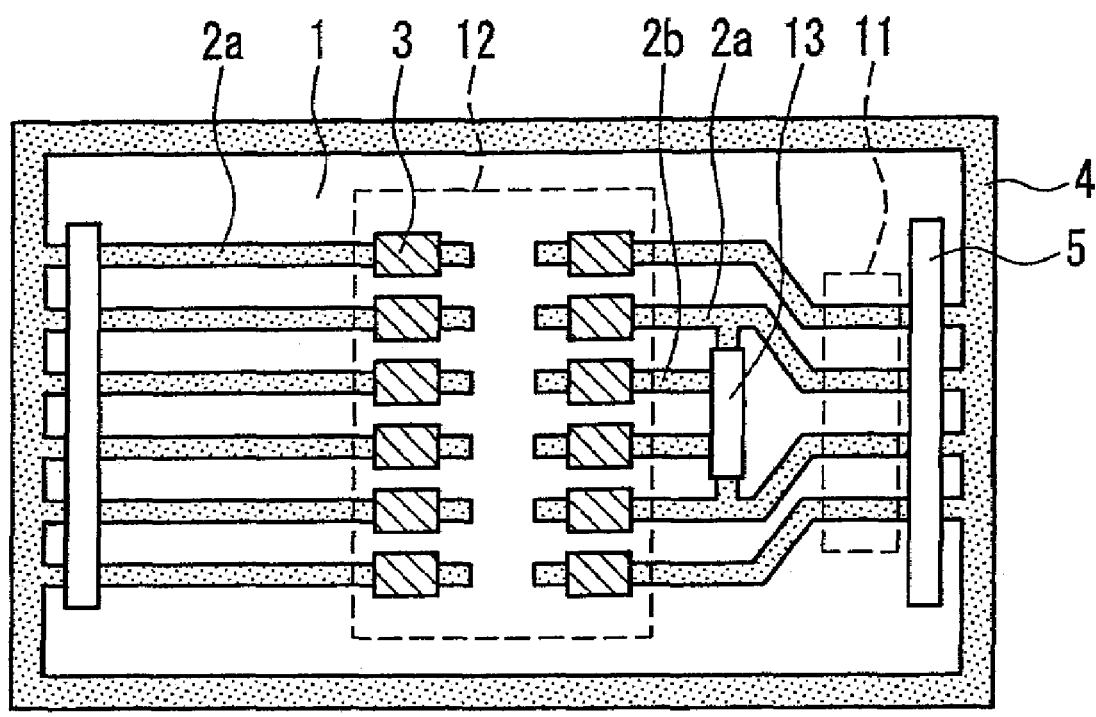
FIG. 1 is a partial plan view of a tape carrier substrate of Embodiment 1 of the present invention.

According to the present invention, the conductive wirings include first conductive wirings and second conductive wirings, on which the bumps are formed respectively at a semiconductor element mounting region on which the semiconductor element is to be mounted. The first conductive wirings extend from the bumps to the connection terminal portion for connection with the external component. The second conductive wirings extend beyond the semiconductor element mounting region from the bumps but do not extend to the connection terminal portion. End portions of the second conductive wirings extending beyond the semiconductor element mounting region are separated electrically from the first conductive wirings by a cutting portion formed at a boundary region with the first conductive wirings. With this configuration, the bumps can be provided at constant intervals so as to include positions corresponding to the electrode pads not used on the semiconductor element, so that the bumps can be shaped uniformly. Thus, the concentration of a stress can be alleviated during the mounting of the semiconductor element, so that a reliable semiconductor device can be provided.

In the wiring board of the present invention, the cutting portion of the second conductive wirings may include a through hole formed in the insulating base.

Furthermore, the second conductive wirings disposed on opposed both sides of the semiconductor element mounting region may be connected mutually.

In the wiring board manufacturing method of the present invention, the cutting portion may be formed by punching the insulating base. Alternatively, the cutting portion may be formed by cutting the first conductive wirings and the second conductive wirings by laser.

A semiconductor device can be configured including the wiring board having any one of the above-stated configurations; and a semiconductor element mounted on the semiconductor element mounting region. Electrode pads of the semiconductor element and the conductive wirings may be connected via the bumps.

In this semiconductor device, the cutting portion may be formed by punching the insulating base, and the cutting portion may be formed outside of a region where an encapsulation resin is applied for protecting the semiconductor element.

The following describes embodiments of the present invention, with reference to the drawings. Note here that the same reference numerals are assigned to the elements similar to those illustrated in the drawings of the above-stated conventional examples, and some of their explanations are not repeated.

Embodiment 1

The following describes the structure of a tape carrier substrate (wiring board) of Embodiment 1, with reference to FIG. 1 that is a partial plan view of the tape carrier substrate.

As shown in FIG. 1, a plurality of conductive wirings 2a and 2b are aligned on a film base (insulating base) 1, and bumps 3 are provided at positions of the conductive wirings 2a and 2b corresponding to electrode pads on a semiconductor element. Reference numeral 12 denotes a region on which the semiconductor element is to be mounted (hereinafter called a semiconductor element mounting region).

The conductive wirings 2a and 2b are divided into first conductive wirings 2a and second conductive wirings 2b. The first conductive wirings 2a are used for connection with an external component as usual. The second conductive wirings 2b correspond to dummy electrode pads of the semiconductor element, and are not used for connection with an external component. The first conductive wirings 2a extend from the region of bumps 3 to a connection terminal portion 11 for connection with the external component. The second conductive wirings 2b extend beyond the semiconductor element mounting region 12 from the region of the bumps 3, but do not reach the connection terminal portion 11. As described later, although at the time of the formation, the second conductive wirings 2b are connected with the first conductive wirings 2a, the second conductive wirings 2b finally are separated electrically from the first conductive wirings 2a by a cutting region 13.

A semiconductor element is mounted on the thus configured tape carrier substrate so that the first conductive wirings 2a correspond to terminals used for output signals of a semiconductor device and the second conductive wirings 2b correspond to terminals not used for output signals. In this way, even when there are conductive wirings that are not used, the bumps 3 can be provided at constant intervals, and therefore the bumps 3 can be shaped uniformly. Therefore, the concentration of a stress can be alleviated during the mounting of a semiconductor element on the tape carrier substrate, so that a reliable semiconductor device can be provided.

Herein, edge portions of the second conductive wirings 2b outside of the semiconductor element mounting region 12 are located at a hole portion of the film base 1 formed as the cutting region 13. With this configuration, a stress applied to the film base 1 during the semiconductor element mounting can be alleviated.

Figure 2A:
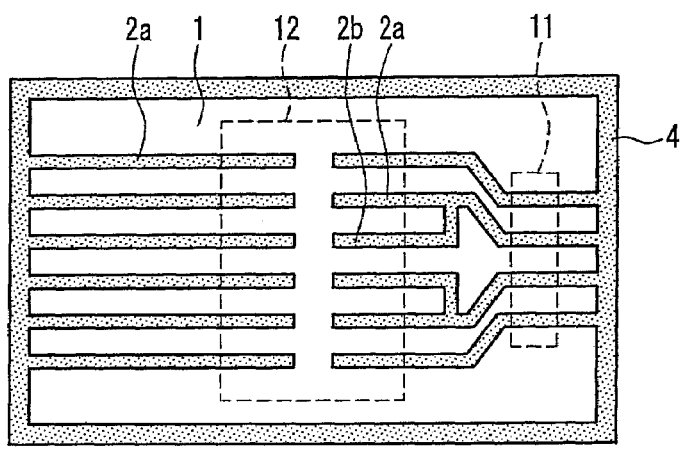
FIGS. 2A to 2C are partial plan views of the tape carrier substrate of Embodiment 1 during the manufacturing steps thereof.
Figure 2B:
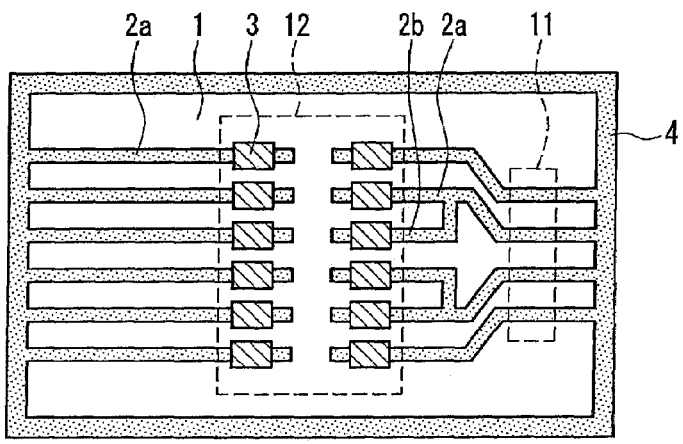
Figure 2C:
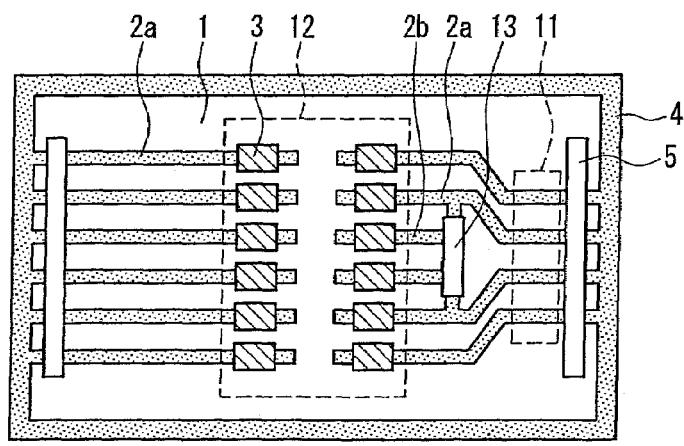

The following describes a method for manufacturing the thus configured tape carrier substrate, with reference to FIG. 2. FIG. 2 shows manufacturing steps of the tape carrier substrate, where FIGS. 2A to 2C are partial plan views showing the state of the tape carrier substrate during the respective manufacturing steps.

First Step

Firstly, as shown in FIG. 2A, a film base (insulating base) 1 is prepared on which a plurality of conductive wirings are aligned. The conductive wirings include first conductive wirings 2a and second conductive wirings 2b. The first conductive wirings 2a extend from a region where bumps are to be formed in a later step to a connection terminal portion 11 with which an external component is connected. The first conductive wirings 2a further are connected with a feeding conductive pattern 4. The second conductive wirings 2b extend beyond a semiconductor element mounting region 12 from the region where bumps are to be formed, but do not extend to the connection terminal portion 11. The second conductive wirings 2b are connected with the first conductive wirings 2a.

Second Step

As shown in FIG. 2B, electroplating is carried out by feeding electricity via the feeding conductive pattern 4, whereby bumps 3 are formed at end portions of the first conductive wirings 2a and the second conductive wirings 2b. The bumps 3 are arranged at positions corresponding to electrode pads of a semiconductor element that is to be mounted on the semiconductor element mounting region 12.

Third Step

As shown in FIG. 2C, the first conductive wirings 2a and the second conductive wirings 2b are removed partially, so as to form cutting regions 5 and 13. The connection portions of the first conductive wirings 2a and the second conductive wirings 2b are separated electrically by the cutting region 13.

With the above-stated manufacturing method, the bumps 3 can be formed at positions corresponding to the electrode pads that are not used on the semiconductor element as well, and therefore the bumps 3 can be designed at constant intervals. As a result, the bumps 3 can be shaped uniformly by electroplating. Thus, the concentration of a stress can be alleviated during the mounting of a semiconductor element on the tape carrier substrate, so that a reliable semiconductor device can be provided.

In the above-stated manufacturing method, as shown in FIG. 2C, the step for forming the cutting region 13 to separate the first conductive wirings 2a from the second conductive wirings 2b electrically and the step for forming the cutting region 5 to separate the first conductive wirings 2a from the feeding conductive pattern 4 are conducted favorably as one step in terms of the efficiency.

As the step for forming the cutting region 13 of FIG. 2C, a method of punching the tape carrier substrate with a die and a method of cutting at least the conductive wirings by laser are available. Especially, in the case of punching of the tape carrier substrate with a die, the punching preferably is conducted outside of a region where an encapsulation resin will be applied for protecting the semiconductor element in a later step.

Furthermore, although not illustrated, the step of FIG. 2C for forming the cutting region 13 to separate the first conductive wirings 2a from the second conductive wirings 2b electrically is not necessarily conducted prior to the semiconductor element mounting. This step may be conducted after the semiconductor element required to have appropriate electrical characteristics is mounted.

With the above-stated wiring board of the present embodiment, semiconductor devices with various numbers of output terminals easily can be accommodated with one type of semiconductor element, thus reducing the developing cost.

Embodiment 2

Figure 3:
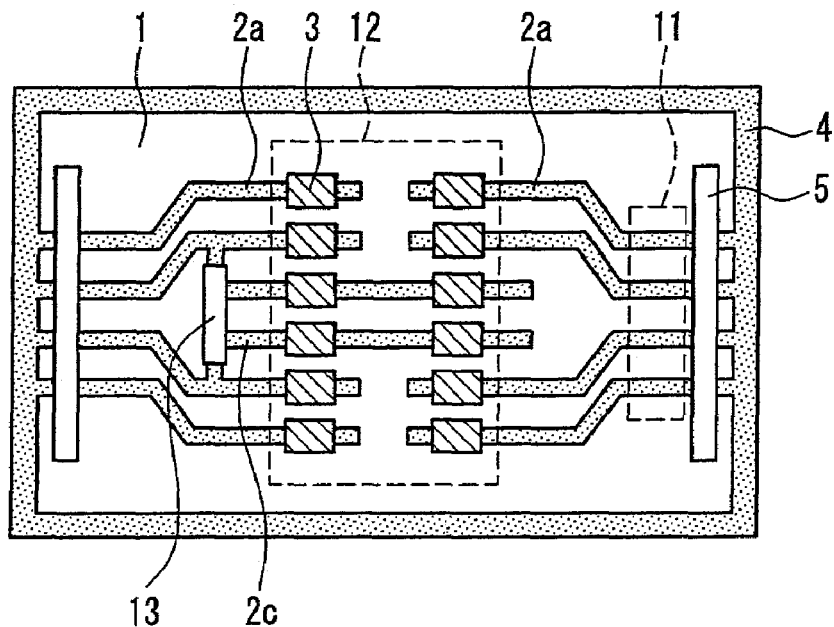
FIG. 3 is a partial plan view of a tape carrier substrate of Embodiment 2 of the present invention.
Figure 4:
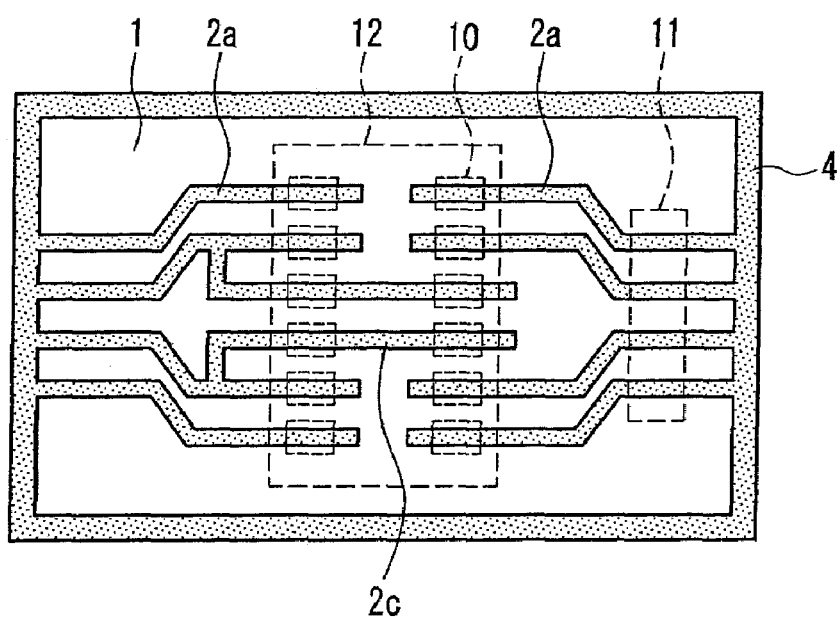
FIG. 4 is a plan view of the tape carrier substrate of Embodiment 2 during one of the manufacturing steps thereof.
Figure 5:
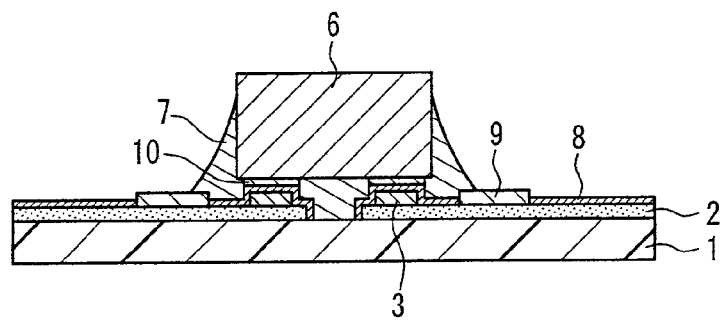
FIG. 5 is a partial cross-sectional view of a conventional semiconductor device.
Figure 6:
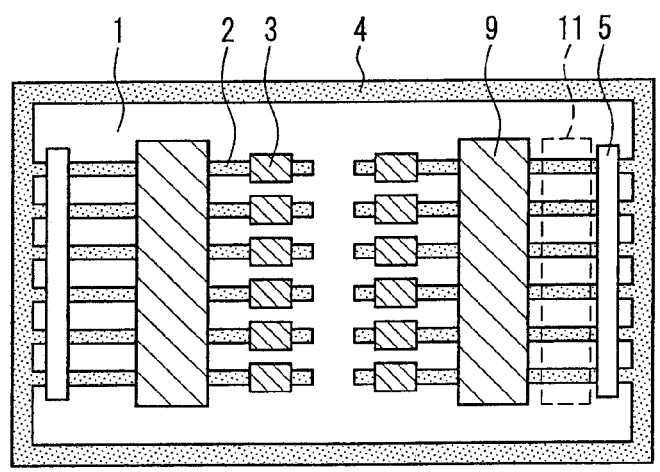
FIG. 6 is a partial plan view of a conventional tape carrier substrate.
Figure 7:
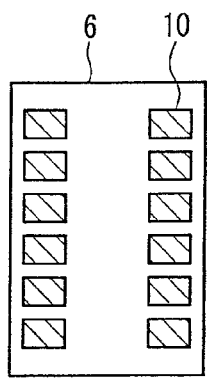
FIG. 7 is a plan view of an exemplary semiconductor element.
Figure 8A:
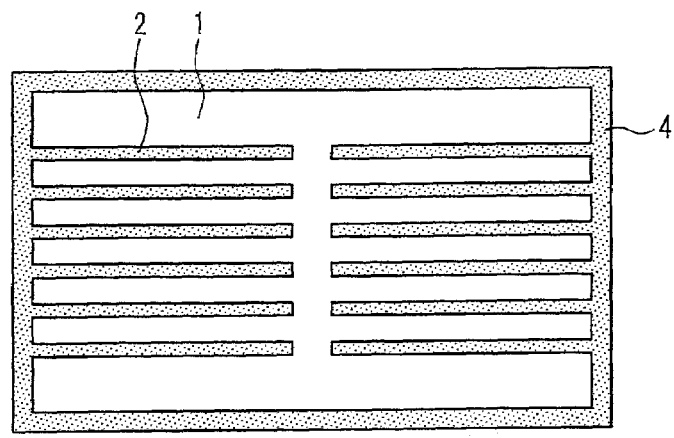
FIGS. 8A to 8C are partial plan views of a tape carrier substrate, which show conventional manufacturing steps of a tape carrier substrate.
Figure 8B:
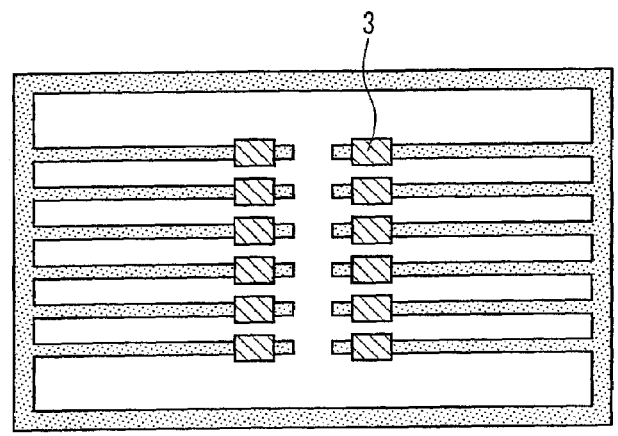
Figure 8C:
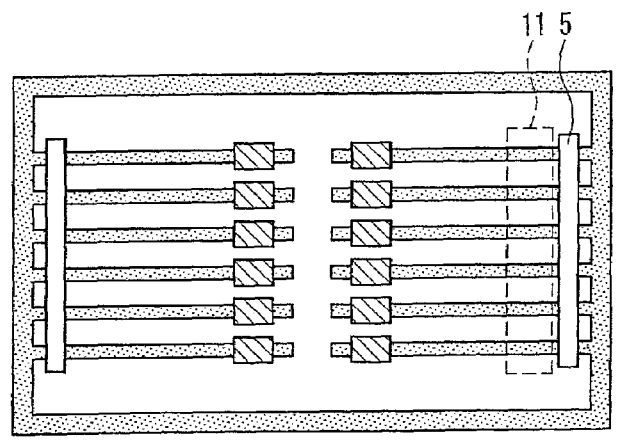
Figure 9:
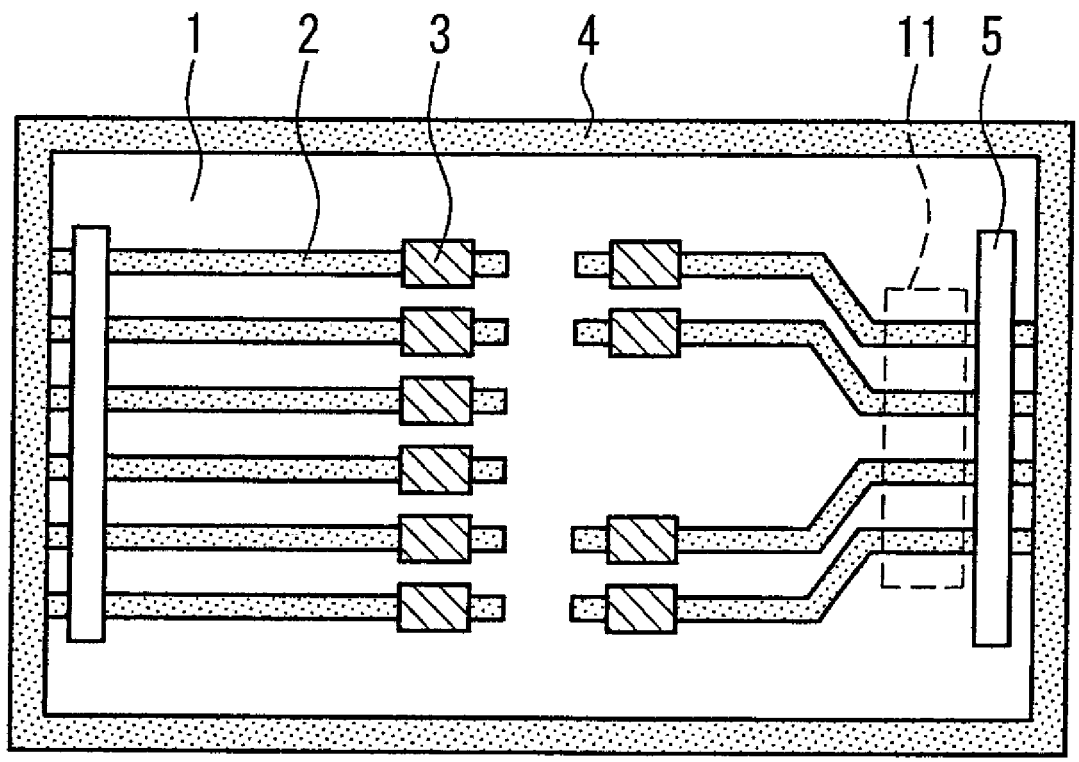
FIG. 9 is a partial plan view of another conventional tape carrier substrate.

FIG. 3 is a partial plan view of a tape carrier substrate of Embodiment 2. FIG. 4 is a plan view showing the state of the tape carrier substrate of Embodiment 2 corresponding to the step of FIG. 2A in Embodiment 1 during the manufacturing steps thereof. The present embodiment is configured so that dummy electrode pads are present on both opposed sides of a semiconductor element. Therefore, some of the bumps 3 formed at horizontally opposed positions in a semiconductor element mounting region 12 are not used for connection with an external component, and second conductive wirings 2c corresponding to such bumps are formed in a similar manner to the second conductive wirings 2b in Embodiment 1 of FIG. 1.

The second conductive wirings 2c are formed so that the wirings on both sides of the horizontal pair of bumps 3 as dummy electrode pads are connected with each other. In other words, two bumps 3 are arranged along one second conductive wiring 2c.

The second conductive wirings 2c have a configuration and a function similar to those of the second conductive wirings 2b of FIG. 1. That is, the second conductive wirings 2c extend beyond a semiconductor element mounting region 12 from a region of the bumps 3, but do not extend to a connection terminal portion 11. Note here that as shown in FIG. 4, the second conductive wirings 2c are connected with first conductive wirings 2a prior to the formation of the bumps, and electroplating is conducted by feeding electricity via the first conductive wirings 2a on the connection side and a feeding conductive pattern 4. After the formation of the bumps 3, a cutting region 13 is formed as shown in FIG. 3, whereby the second conductive wirings 2c and the first conductive wirings 2a are separated electrically.

At a region on the right side of the semiconductor element mounting region 12, the second conductive wirings 2c are not connected with the first conductive wirings 2a from the time of the formation thereof.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A wiring board, comprising:
   an insulating base;
   a plurality of conductive wirings provided on the insulating base; and
   bumps formed on the plurality of conductive wirings, respectively,
   wherein the plurality of conductive wirings can be connected with electrode pads of a semiconductor element to be mounted via the bumps, and
   the plurality of conductive wirings include a connection terminal portion at an end portion opposite to the other end portion where the bumps are formed, and at the connection terminal portion, the conductive wirings can be connected with an external component,
   wherein the plurality of conductive wirings comprise first conductive wirings and second conductive wirings, on which the bumps are formed respectively at a semiconductor element mounting region on which the semiconductor element is to be mounted,
   the first conductive wirings extend from the bumps to the connection terminal portion for connection with the external component,
   the second conductive wirings extend beyond the semiconductor element mounting region from the bumps but do not reach the connection terminal portion, and end portions of the second conductive wirings extending beyond the semiconductor element mounting region are separated electrically from the first conductive wirings by a cutting portion formed at a boundary region with the first conductive wirings.

2. The wiring board according to claim 1, wherein the cutting portion of the second conductive wirings comprises a through hole formed in the insulating base.

3. The wiring board according to claim 1, wherein the second conductive wirings disposed on opposed both sides of the semiconductor element mounting region are connected mutually.

4. A semiconductor device, comprising:
   the wiring board according to claim 1; and
   a semiconductor element mounted on the semiconductor element mounting region,
   wherein electrode pads of the semiconductor element and the conductive wirings are connected via the bumps.

5. The semiconductor device according to claim 4, wherein the cutting portion is formed by punching the insulating base, and the cutting portion is formed outside of a region where an encapsulation resin is applied for protecting the semiconductor element.

6. A method for manufacturing a wiring board comprising: an insulating base; a plurality of conductive wirings provided on the insulating base; and bumps formed on the plurality of conductive wirings, respectively, wherein the plurality of conductive wirings can be connected with electrode pads of a semiconductor element to be mounted via the bumps, and the plurality of conductive wirings include a connection terminal portion at an end portion opposite to the other end portion where the bumps are formed, and at the connection terminal portion, the conductive wirings can be connected with an external component, the method comprising the steps of:
   using the insulating base having first conductive wirings and second conductive wirings as the plurality of conductive wirings provided thereon, the first conductive wirings extending from a position where the bumps are to be formed to the connection terminal portion for connection with the external component and the second conductive wirings extending beyond a semiconductor element mounting region from the position where the bumps are to be formed and not reaching the connection terminal portion, the first conductive wirings and the second conductive wirings being connected electrically;
   carrying out electroplating by feeding electricity via the second conductive wirings, so as to form the bumps on the first conductive wirings and the second conductive wirings; and
   forming a cutting portion that separates the first conductive wirings and the second conductive wirings electrically.

7. The method for manufacturing a wiring board according to claim 6, wherein the cutting portion is formed by punching the insulating base.

8. The method for manufacturing a wiring board according to claim 6, wherein the cutting portion is formed by cutting the first conductive wirings and the second conductive wirings by laser.

* * * * *